(12) United States Patent
Tabata et al.

(10) Patent No.: US 11,574,814 B2
(45) Date of Patent: Feb. 7, 2023

(54) SUBSTRATE AND SUBSTRATE PROCESSING METHOD

(71) Applicant: Tokyo Electron Limited, Tokyo (JP)

(72) Inventors: Masahiro Tabata, Miyagi (JP); Masahiro Tadokoro, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/991,173

(22) Filed: Aug. 12, 2020

(65) Prior Publication Data

US 2021/0050219 A1    Feb. 18, 2021

(30) Foreign Application Priority Data

Aug. 13, 2019 (JP) .............. JP2019-148299

(51) Int. Cl.
*H01L 21/311* (2006.01)
*B32B 3/10* (2006.01)

(52) U.S. Cl.
CPC .......... *H01L 21/31116* (2013.01); *B32B 3/10* (2013.01); *H01L 21/31144* (2013.01); *Y10T 428/24802* (2015.01)

(58) Field of Classification Search
CPC ...................................................... B32B 3/10
See application file for complete search history.

(56) References Cited

U.S. PATENT DOCUMENTS

2011/0101538 A1* 5/2011 Ponoth .................. H01L 21/768
257/774
2016/0189975 A1* 6/2016 Takeda .............. H01J 37/32091
438/712

FOREIGN PATENT DOCUMENTS

JP          2016-122774 A       7/2016

* cited by examiner

*Primary Examiner* — Ian A Rummel
(74) *Attorney, Agent, or Firm* — Pearne & Gordon LLP

(57) ABSTRACT

A substrate includes an etching target film as a target of etching and a first film. The first film is formed on the etching target film and is made of a material having an etching rate smaller than an etching rate of the etching target film. The first film has multiple first openings formed at a first distance therebetween in one direction of a surface of the first film. The first film has a second opening formed at an outside of the multiple first openings in the one direction while being spaced apart from an outermost one of the first openings by a second distance equivalent to the first distance. The second opening has a width larger than a width of the first openings and a depth smaller than a depth of the first openings.

8 Claims, 10 Drawing Sheets

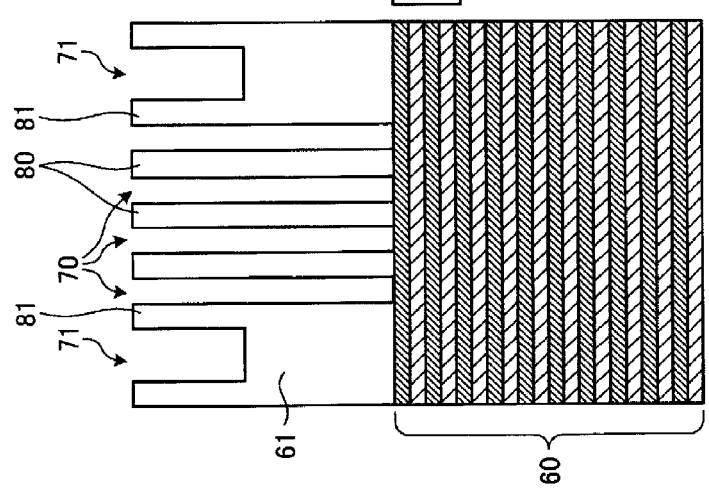
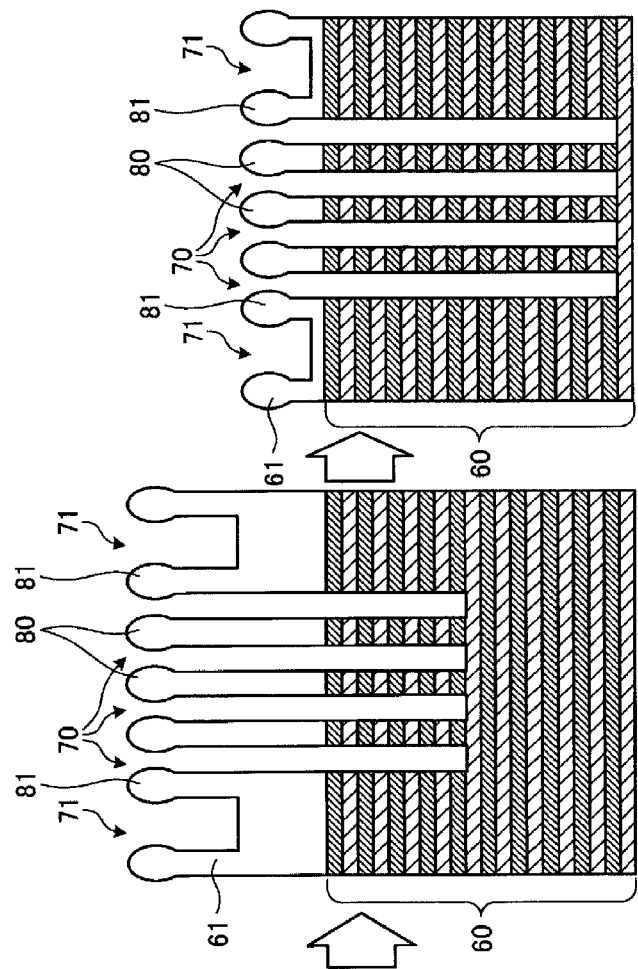
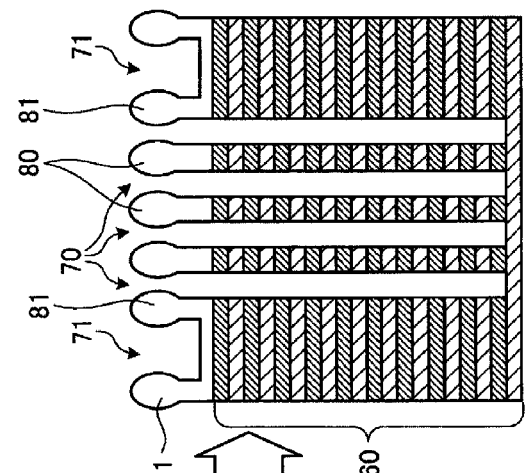

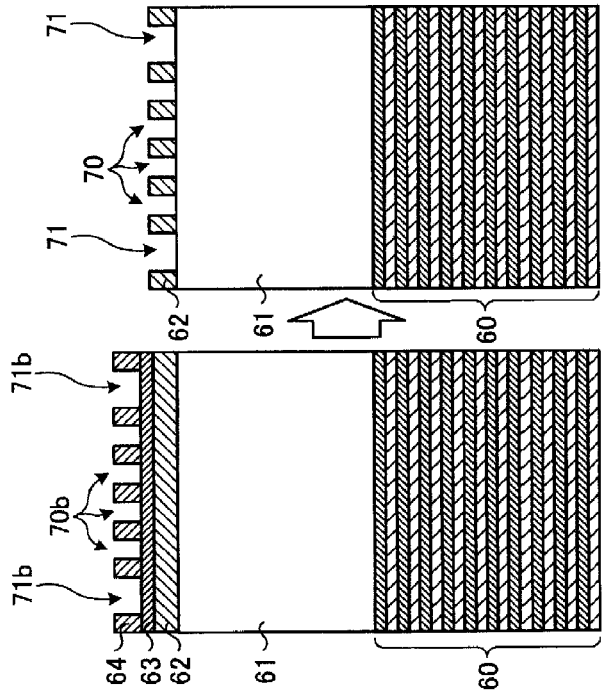

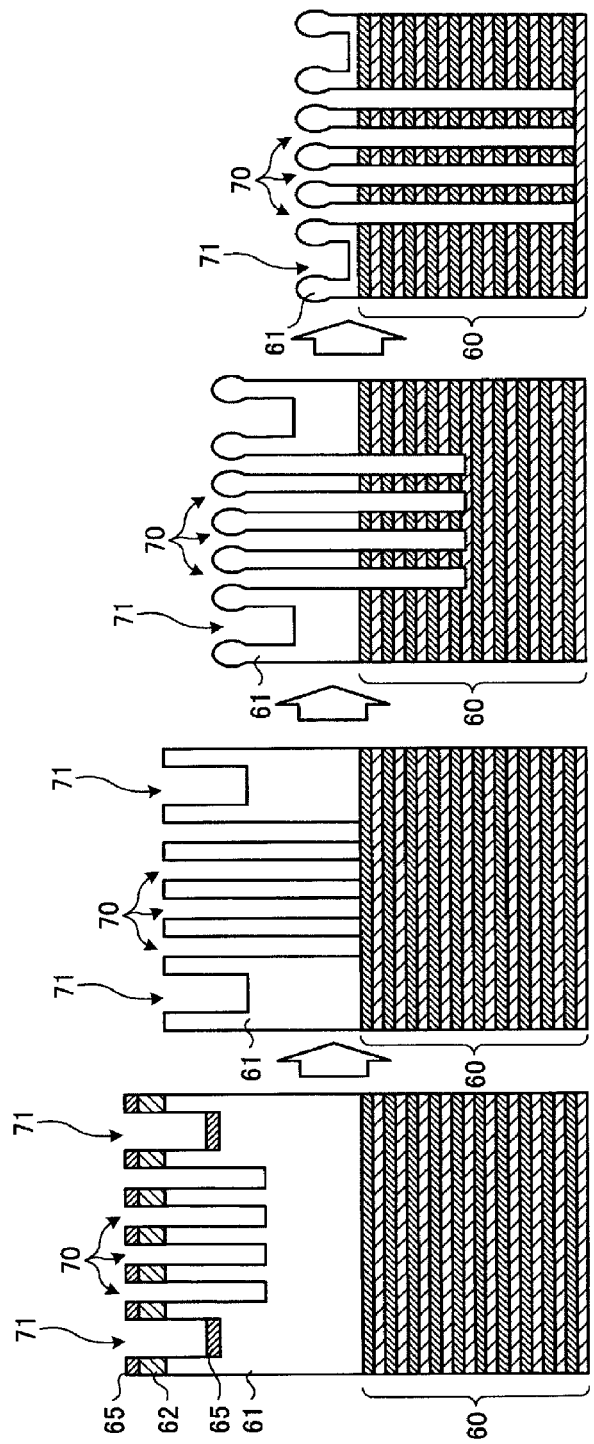

SUBSTRATE AND SUBSTRATE PROCESSING METHOD

CROSS-REFERENCE TO RELATED APPLICATION

This application claims the benefit of Japanese Patent Application No. 2019-148299 filed on Aug. 13, 2019, the entire disclosure of which is incorporated herein by reference.

TECHNICAL FIELD

The various aspects and embodiments described herein pertain generally to a substrate and a substrate processing method.

BACKGROUND

Patent Document 1 describes a technique of forming an opening such as a hole or a groove having a high aspect ratio by etching.

Patent Document 1: Japanese Patent Laid-open Publication No. 2016-122774

SUMMARY

In one exemplary embodiment, a substrate includes an etching target film as a target of etching and a first film. The first film is formed on the etching target film and is made of a material having an etching rate smaller than an etching rate of the etching target film. The first film has multiple first openings formed at a first distance therebetween in one direction of a surface of the first film. The first film has a second opening formed at an outside of the multiple first openings in the one direction while being spaced apart from an outermost one of the first openings by a second distance equivalent to the first distance. The second opening has a width larger than a width of the first openings and a depth smaller than a depth of the first openings.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 3A to FIG. 3C are diagrams illustrating an example of changes with an etching of the substrate according to the exemplary embodiment;

FIG. 5A to FIG. 5D present diagrams illustrating an example of a flow of changes in a wafer in individual processes of the substrate processing method according to the exemplary embodiment;

FIG. 5E to FIG. 5H depict diagrams illustrating an example of a flow of changes in the wafer in individual processes of the substrate processing method according to the exemplary embodiment;

DETAILED DESCRIPTION

Figure 1:
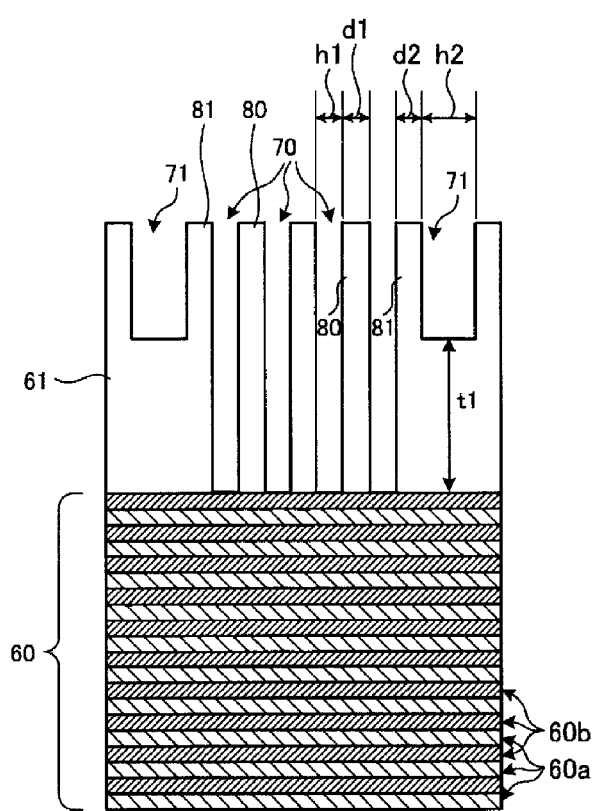
FIG. 1 is a cross sectional view schematically illustrating an example structure of a substrate according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate and a substrate processing method of the present disclosure will be described in detail with reference to the accompanying drawings. However, it should be noted that the substrate and the substrate processing method of the present disclosure is not limited by the following exemplary embodiments.

In a substrate processing, openings such as holes or grooves may be densely formed in an etching target film on a substrate. By way of example, in the manufacture of a three-dimensional stacked semiconductor memory such as a 3D-NAND flash memory, there is performed a process of forming holes having a high aspect ratio densely in a stacked film which is composed of a multiple number of insulating films stacked on top of each other. In this process, by way of example, a mask film is first formed on an etching target film of a substrate. Openings are formed in the mask film at positions corresponding to where openings of the etching target film will be formed. Then, the etching target film is etched by using the mask film as a mask. As a result of the etching, the etching target film is provided with the openings formed to correspond to the openings of the mask film. Here, however, there may be caused a discrepancy in the shape of the individual openings formed in the etching target film. By way of example, the openings formed at a peripheral portion of a region where the multiple number of openings are formed may be shallow, as compared to the openings formed at a central portion of this region.

In this regard, there is a demand for a technique capable of suppressing the discrepancy in the shape of the individual openings formed in the etching target film.

PRIOR ART

Figure 7:
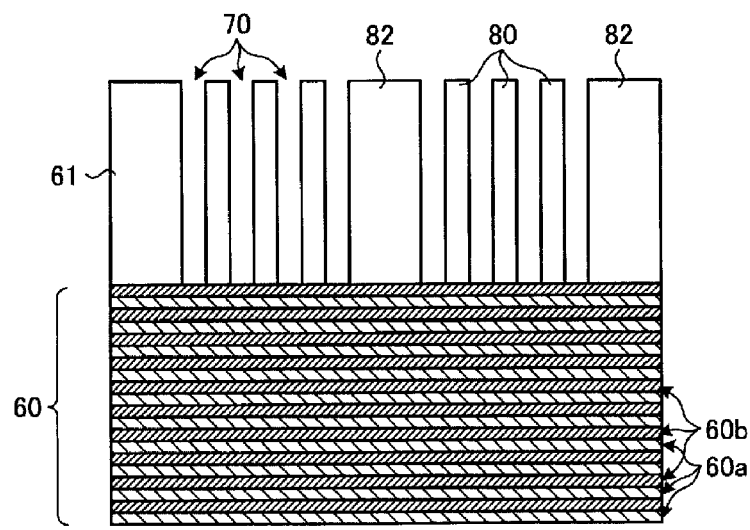
FIG. 7 is a cross sectional view schematically illustrating an example structure of a conventional substrate.

First, an example structure of a conventional substrate will be explained. FIG. 7 is a cross sectional view schematically illustrating the example structure of the conventional substrate. The substrate is a silicon wafer (hereinafter, simply referred to as "wafer").

FIG. 7 illustrates an example of a layer structure of a wafer W for use in manufacturing a three-dimensional stacked semiconductor memory. The wafer W is provided with a stacked film 60. The stacked film 60 is prepared by stacking two kinds of insulating films having different permittivity on top of each other alternately. By way of example, the stacked film 60 has a structure in which silicon oxide films 60a such as SiO and silicon nitride films 60b such as SiN are stacked on top of each other alternately. The wafer W has, on top of the stacked film 60, an amorphous carbon layer (ACL) 61 as an organic material. The ACL 61 is provided with openings 70 formed at positions corresponding to where openings will be formed in the stacked film 60. Further, the ACL 61 provided with the openings 70 serves as partition walls 80 between the multiple openings 70, and also serves as partition walls 82 between a region where the multiple openings 70 are formed and a region where other multiple openings 70 are formed. A width of the partition wall 82 is sufficiently large as compared to a width of the partition wall 80.

Figure 8:
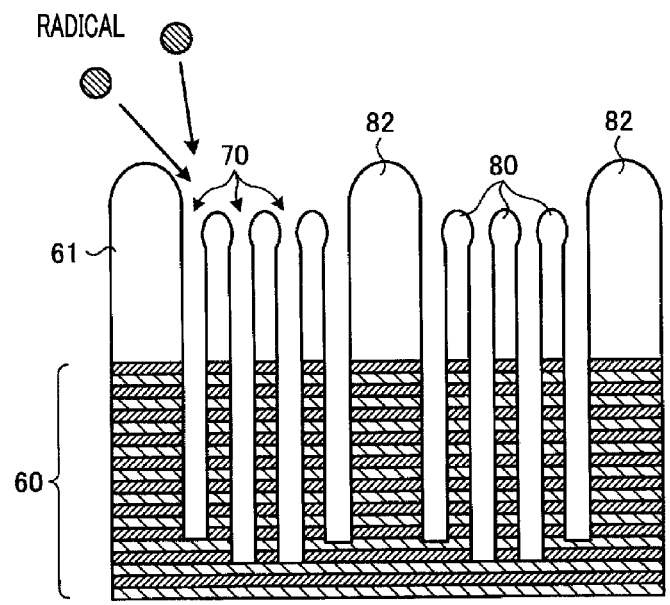
FIG. 8 is a diagram showing a result of etching a stacked film of the conventional substrate.

In the manufacture of the three-dimensional stacked semiconductor memory, the stacked film 60 is etched by using the ACL 61 as a mask. By way of example, plasma is formed by applying a high frequency power of a preset frequency while supplying a mixed gas including a fluorocarbon gas such as a $C_4F_8$ gas and a rare gas such as an Ar gas, so that the stacked film 60 is plasma-etched. FIG. 8 is a diagram showing a result of etching the stacked film 60 of the conventional substrate.

Since the openings 70 are extended to reach the stacked film 60, the stacked film 60 under the openings 70 is plasma-etched. As a result, the openings 70 are formed in the stacked film 60 as well. However, at a central portion and a peripheral portion of a region where the multiple openings 70 are formed, there may be caused a discrepancy in a shape of these multiple openings 70. By way of example, the openings 70 formed at the peripheral portion is shallower than the openings 70 formed at the central portion. Further, when the ACL 61 is etched from a top surface thereof by the plasma etching, the central portion of the region thereof where the multiple openings 70 are formed is etched more. As a result, a height of the partition wall 80 becomes lower than a height of the partition wall 82.

This discrepancy in the shape of the openings 70 between the central portion and the peripheral portion is deemed to be caused for the following reasons.

Figure 9:
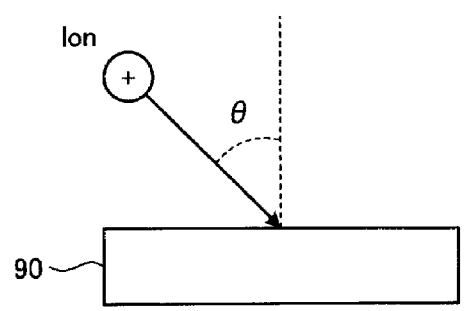
FIG. 9 is a diagram showing an incident angle of an ion upon a target film.
Figure 10:
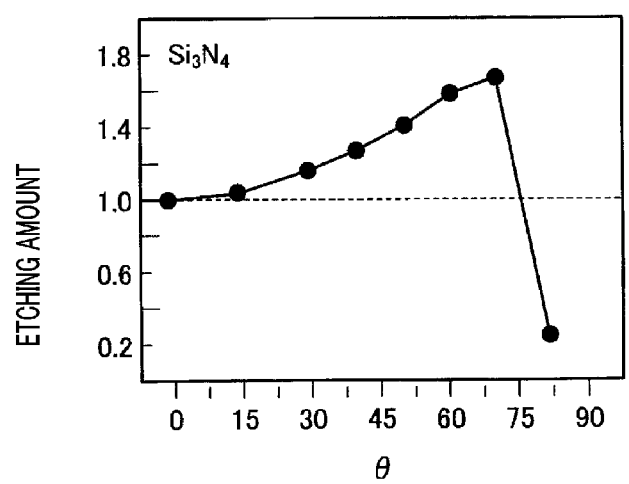
FIG. 10 is a graph showing an example of a relationship between the incident angle of the ion and an etching amount of the target film.

In the plasma etching, a target film is etched as radicals or ions generated in the plasma are incident upon the target film. In the plasma etching, an etching amount depends on an incident angle. FIG. 9 is a diagram illustrating an incident angle of an ion upon a target film 90. FIG. 9 shows an incident angle θ of an ion upon the target film 90 with respect to a vertical direction. FIG. 10 is a graph showing an example of a relationship between the incident angle of the ion and the etching amount of the target film 90. The example of FIG. 10 shows a relationship between the incident angle θ and the etching amount when the target film 90 is a $Si_3N_4$ film. The etching amount in the graph is expressed as a normalized value with the etching amount at the incident angle θ of zero (θ=0) defined as 1. In the plasma etching, the etching amount increases when the incident angle θ is in the range from 0° to 60°, and if the incident angle θ exceeds 60°, the etching amount decreases rapidly.

Figure 11:
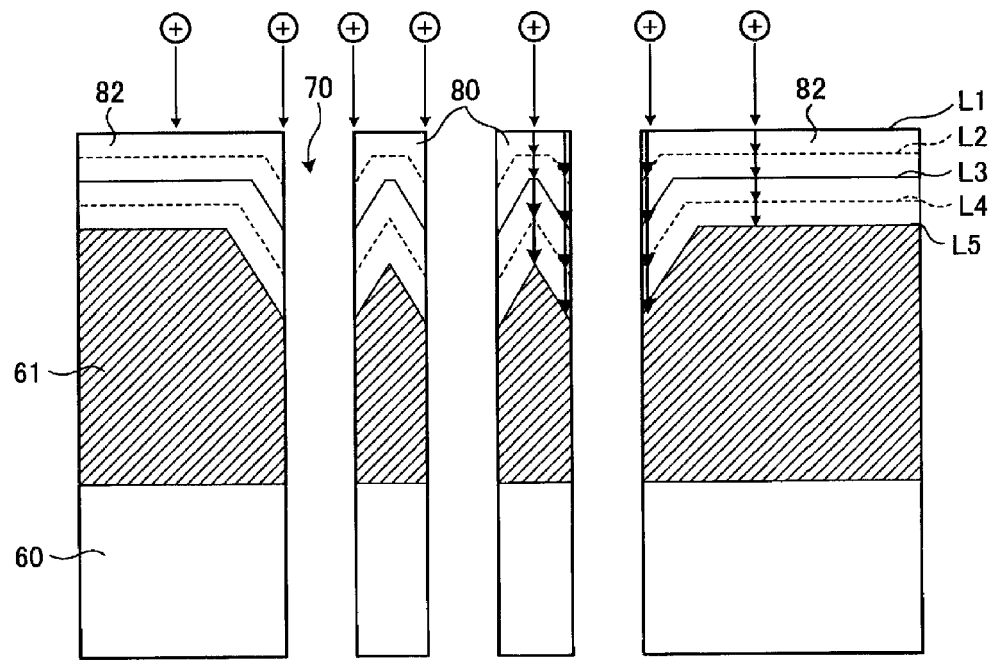
FIG. 11 is a diagram schematically illustrating an example of a change in an amorphous carbon layer (ACL) with a progress of plasma etching.

An etching amount of the ACL 61 at a corner portion of a top surface thereof is larger than an etching amount at a flat portion of the top surface thereof as the radicals or the ions are incident on the corner portion, which serves as an upper end of the opening 70, from various angles. Thus, a rectangular shape may be easily turned into a round shape or a tapered shape. If the ACL 61 has the round shape or the tapered shape, the incident angle θ of the ion from the plasma is turned from a vertical angle (0°) into a gradient ranging up to 60°, the etching amount is further increased. FIG. 11 is a diagram illustrating a change of the ACL 61 with a progress of the plasma etching. In FIG. 11, a change of the top surface of the ACL 61 with a lapse of time in the plasma etching is indicted by L1 to L5. L1 shows a state before the etching. L5 shows a state upon the completion of the etching. Since the ACL 61 has the multiple number of openings 70, portions of the top surface of the ACL 61 near the corner portions of the openings 70 are etched rapidly, turning into tapered shapes. Since the partition wall 80 between the openings 70 is etched from both sides, a flat portion of a top surface of the partition wall 80 may be removed during the plasma etching (after L3 in FIG. 11), so that the etching of the partition wall 80 may be accelerated. Meanwhile, since a flat portion of a top surface of the partition wall 82 is maintained during the etching, the etching of the partition wall 82 is not accelerated. As a result, a height of the partition wall 82 becomes higher than a height of the partition wall 80 during a period from the middle of the plasma etching (after L3 in FIG. 11) until an end of the etching. Further, at the peripheral portion of the region where the multiple openings 70 are formed, the height of the ACL 61 becomes different at the left and the right of the openings 70. In such a case, since the degree of easiness of the introduction of the radicals or the ions into the openings 70 is different, the radicals or the ions reaching the bottoms of the openings 70 may be reduced at the peripheral portion of the region where the multiple openings 70 are formed, as compared to the central portion of this region, so that an etching rate thereat is reduced. As a result, the openings 70 formed at the peripheral portion become shallower than the openings formed at the central portion.

Exemplary Embodiment

<Structure of Substrate>

Figure 2:
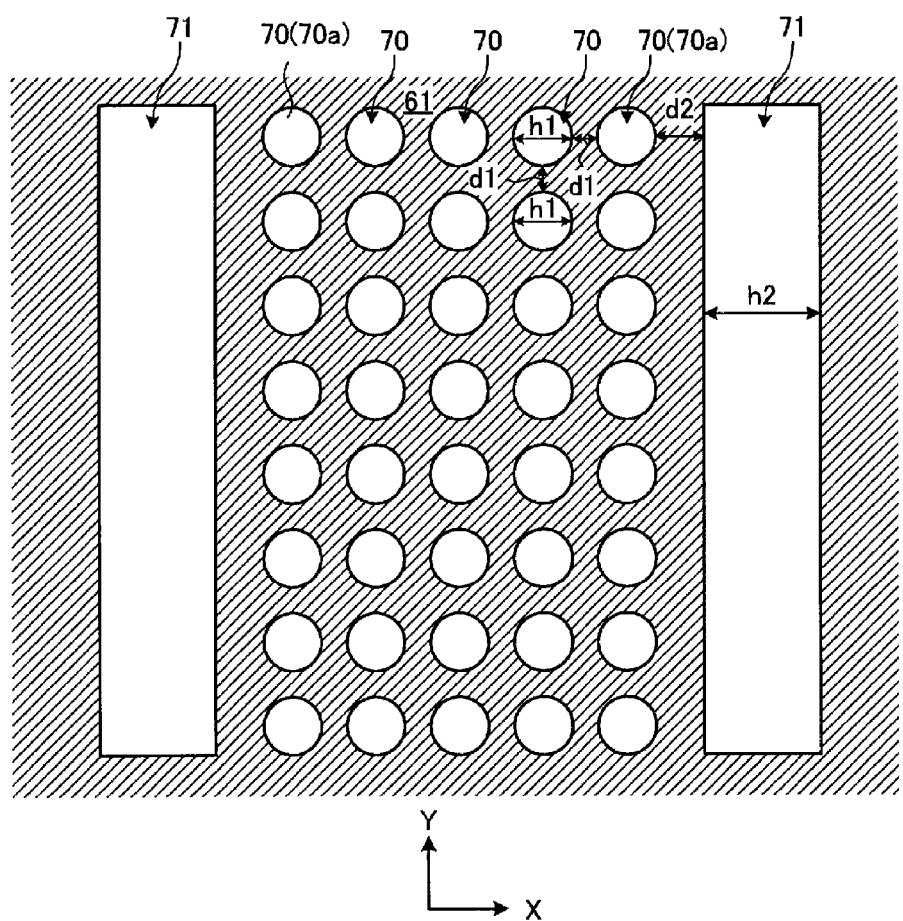
FIG. 2 is a plan view schematically illustrating the example structure of the substrate according to the exemplary embodiment.

In view of the foregoing, in the present exemplary embodiment, a substrate has a structure to be described below. FIG. 1 is a cross sectional view schematically illustrating an example structure of a substrate according to the exemplary embodiment. FIG. 2 is a plan view schematically illustrating the example structure of the substrate according to the exemplary embodiment. Here, a wafer W serves as the substrate.

FIG. 1 illustrates an example of a layer structure of the wafer W for use in manufacturing a three-dimensional stacked semiconductor memory. The wafer W has a stacked film 60, and an ACL 61 is formed on the stacked film 60. The stacked film 60 is an example of an etching target film. The ACL 61 is an example of a first film. The stacked film 60 is composed of two kinds of insulating films having different permittivity, and these two kinds of insulating films are alternately stacked on top of each other. By way of example, the stacked film 60 has a structure in which multiple silicon oxide films 60a such as SiO and multiple silicon nitride films 60b such as SiN are alternately stacked on top of each other.

The ACL 61 has openings 70 formed at positions corresponding to where openings will be formed in the stacked film 60. Further, the ACL 61 also has openings 71 formed at an outside of the openings 70.

Here, an example layout of the openings 70 and the openings 71 on the wafer W will be explained. FIG. 2 illustrates the example layout of the openings 70 and the openings 71 according to the exemplary embodiment. FIG. 2 is a diagram illustrating the ACL 61 of the wafer W, seen from above, and it shows the arrangement of the openings 70 and the openings 71 formed in the ACL 61. Further, illustration of FIG. 1 is simplified with a smaller number of openings 70 than those shown in FIG. 2.

The multiple openings 70 are arranged on a surface of the ACL 61 at a regular distance d1 therebetween in the X and Y directions which are orthogonal to each other. Each opening 70 is a circular hole having a width (diameter) of h1. Further, on the surface of the ACL 61, the openings 71 are formed at the outside of the multiple openings 70. In FIG. 2, the openings 71 are provided at the outside of the multiple openings 70 in the X direction while being distanced apart from the outermost opening 70a by a distance d2. Each opening 71 is a rectangular trench (groove) elongated in the Y direction at the outside of the opening 70a. A width h2 of the opening 71 in the X direction is larger than the width h1 of the opening 70a. Further, the opening 71 may be a circular or oval hole. A distance d2 between the opening 70a and the opening 71 needs to be approximately equivalent to the distance d1. By way of example, the distance d2 may be in the range from 0.5 times to twice the distance d1. For example, in case of the three-dimensional stacked semiconductor memory, the width h1 of the opening 70 is in the range from 50 nm to 200 nm, and the distance d1 between the openings 70 is in the range from 30 nm to 200 nm. The distance d2 between the opening 70a and the opening 71 is in the range from 30 nm to 300 nm, and the width h2 of the opening 71 is in the range from 100 nm to 400 nm. Further, though the openings 71 are formed at the outside of the multiple openings 70 in the X direction in FIG. 2, additional openings 71 may be formed at the outside of the multiple openings 70 in the Y direction. Furthermore, though the multiple openings 70 are arranged in a lattice shape (rectangular shape) in FIG. 2, the exemplary embodiment is not limited thereto, and the multiple openings 70 may be arranged in, for example, a triangular shape or a honeycomb shape.

As depicted in FIG. 1, the opening 71 is formed to have a depth smaller than a depth of the opening 70. By way of example, the opening 70 is formed to reach the stacked film 60. The opening 71 is formed not to reach the stacked film 60 such that a distance from a bottom surface of the opening 71 to the stacked film 60 becomes a thickness t1.

In the manufacture of the three-dimensional stacked semiconductor memory, on the wafer W having the openings 70 and 71 formed therein as described in the present exemplary embodiment, the stacked film 60 is etched by using the ACL 61 as a mask. By way of example, plasma is formed by applying a high frequency power of a preset frequency while supplying a mixed gas including a fluorocarbon gas such as a $C_4F_8$ gas and a rare gas such as an Ar gas, and the stacked film 60 is plasma-etched.

FIG. 3A to FIG. 3C are diagrams illustrating changes with the progress of the etching of the substrate according to the exemplary embodiment. FIG. 3A illustrates an initial state of the wafer W before being etched. FIG. 3B illustrates a state of the wafer W during the etching. FIG. 3C illustrates a state of the wafer W after being etched. Since the openings 70 are extended to reach the stacked film 60, the stacked film 60 under these openings 70 is etched as the etching progresses. As a result, the openings 70 are also formed in the stacked film 60. Further, since the openings 71 are provided at the outside of the openings 70 while being spaced apart from the openings 70 by the distance d2 which is equivalent to the distance d1, partition walls 80 between the openings 70 and partition walls 81 between the openings 70 and the openings 71 are etched to the same extent from both sides to be lowered to the same level. Accordingly, the etching progresses to the same extent at a central portion and a peripheral portion of a region where the openings 70 are provided, so that the discrepancy in the shape of the openings 70 can be suppressed.

Meanwhile, since the openings 71 does not reach the stacked film 60, the ACL 61 under the openings 71 is etched as the etching progresses. As compared to the stacked film 60, the ACL 61 has a lower etching rate, and the etching of the ACL 61 progresses slowly. Therefore, by setting the thickness t1 to the stacked film 60 in an initial state to be of an appropriate value, the opening 71 is made not to reach the stacked film 60 at the end of the etching. The opening 71 is formed to have an appropriate depth such that it does not reach the stacked film 60 even when the etching is completed. That is, in the present exemplary embodiment, the opening 71 is formed at a position where the etching of the stacked film 60 is not required, and the depth of the opening 71 is set such that the stacked film 60 under it is not etched. By way of example, the opening 71 is formed to have a depth allowing the thickness t1 to the stacked film 60 in the initial state to be larger than an etching amount of the ACL 61 in the etching of the stacked film 60. Accordingly, it is possible to suppress the opening 71 from being formed in the stacked film 60 upon the completion of the etching of the stacked film 60.

Further, when the stacked film 60 is etched, the ACL 61 is also etched. In general, the etching rate of the ACL 61 is higher in a wider area, and an etching rate of the top surface of the ACL 61 is higher than an etching rate of a bottom portion of the opening 71. By way of example, if the etching rate of the top surface of the ACL 61 is denoted by X and the etching rate of the bottom portion of the opening 70 is denoted by Y, there is established a relationship of X>Y. For the reason, if the opening 71 is too shallow, the etching of the top surface of the ACL 61 reaches a bottom surface of the opening 70 during the etching, resulting in disappearance of the opening 70. Thus, the opening 71 is formed to have the depth allowing the depth from the top surface of the ACL 61 upon the completion of the etching of the stacked film 60 to become equal to or larger than a preset value. By way of example, if a processing time of the etching is denoted by T and a minimum depth of the opening 71 required at the end of the etching is denoted by α, the opening 71 is formed to have a depth D larger than that specified in the following expression (1). Here, α needs to be roughly equivalent to the distance d2 between the opening 70a and the opening 71.

$$D = (X-Y) \times T + \alpha \quad (1)$$

As stated above, the opening 71 is formed to have the depth in a range allowing the opening 71 not to reach the stacked film 60 at the end of the etching while allowing the thickness from the top surface of the ACL 61 at the moment to become equal to or larger than the preset value. Accordingly, since the opening 71 does not reach the stacked film 60 upon the completion of the etching, it is possible to suppress the opening 71 from being formed in the stacked film 60. Further, since the opening 71 remains in the ACL 61 at the end of the etching, the discrepancy in the shape of the openings 70 can be suppressed.

<Manufacturing Method for Substrate>

Figure 4:
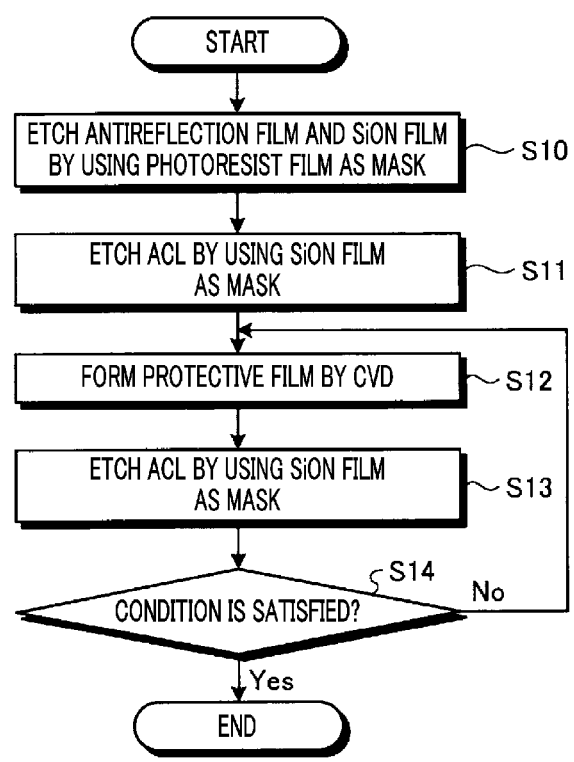
FIG. 4 is a diagram illustrating a flow of a substrate processing method according to the exemplary embodiment.

Now, a flow of a substrate processing method of manufacturing the wafer W having the structure according to the present exemplary embodiment will be explained. FIG. 4 is a diagram illustrating an example of the flow of the substrate processing method according to the exemplary embodiment. FIG. 5A to FIG. 5H are diagrams illustrating an example of changes made in the wafer W in individual processes of the substrate processing method according to the exemplary embodiment.

First, a wafer W as illustrated in FIG. 5A is prepared. The wafer W has a stacked film 60, and an ACL 61 is formed on the stacked film 60. Further, the wafer W has a SiON film 62 formed on the ACL 61, and an antireflection film 63 made of an organic material such as BARC (Bottom Anti-Reflective Coating) is formed on the SiON film 62. The SiON film 62 is an example of a second film. Further, the wafer W also has a photoresist film 64 formed on the antireflection film 63. The photoresist film 64 is provided with openings 70b formed by lithography at positions corresponding to where openings 70 will be formed in the stacked film 60 and the ACL 61, and also provided with openings 71b formed at positions corresponding to where openings 71 will be formed in the ACL 61. Since a width of the opening 71 formed in the ACL 61 is larger than a width of the opening 70 formed therein, the opening 71b is formed to have a width larger than a width of the opening 70b.

The antireflection film 63 and the SiON film 62 are etched by using the photoresist film 64 as a mask (process S10). By way of example, plasma is formed by applying a high frequency power of a preset frequency while supplying, for example, a $CF_4$ gas, and the antireflection film 63 and the SiON film 62 are plasma-etched. Then, the photoresist film 64 and the antireflection film 63 are removed. Accordingly, as illustrated in FIG. 5B, the openings 70 are formed in the SiON film 62 at the positions corresponding to the openings 70b of the photoresist film 64, and the openings 71 are formed at the positions corresponding to the openings 71b. Further, since the photoresist film 64 and the antireflection film 63 are made of the same organic material as the ACL 61 and configured to be removed in the subsequent process of etching the ACL 61, the photoresist film 64 and the antireflection film 63 may not be removed as shown in FIG. 5B.

Then, the ACL 61 is etched by using the SiON film 62 as a mask (process S11, FIG. 5C). Plasma is formed by applying the high frequency power of the preset frequency while supplying, for example, $O_2$ gas, and the ACL 61 is plasma-etched. Since the openings 70 and 71 are extended to the ACL 61, the ACL 61 under these openings are etched by this plasma etching. As a result, the openings 70 and 71 are formed in the ACL 61 as well.

Here, since the opening 71 has the width larger than that of the opening 70, an etching rate for the opening 71 is higher than an etching rate for the opening 70. Accordingly, the opening 71 is etched deeper than the opening 70. If the etching is carried out in this state, the opening 71 is formed to be deeper than the opening 70.

In view of this, a protective film is formed at a bottom of each opening 71 which is formed in the ACL 61 (process S12, FIG. 5D). By way of example, a $SiO_2$ film 65 is formed on the wafer W as the protective film by chemical vapor deposition (CVD) using a $SiCl_4$ gas or a TEOS (Tetraethyl Orthosilicate) gas and an $O_2$ gas. In the CVD, since a step coverage is generally poor, a film is not formed conformally. Thus, the film is formed a lot in an exposed wide area, whereas the film is difficult to form in a narrow opening or the like. For the reason, the $SiO_2$ film 65 is formed thick on a top surface of the SiON film 62 and at the bottom of the opening 71, whereas it is formed thin at a bottom of the opening 70. Then, etching of the $SiO_2$ film 65 of the wafer W is performed. At this time, it is desirable to perform isotropic etching capable of etching the film uniformly in overall or atomic layer etching (ALE). By way of example, as the isotropic etching, plasma is formed by applying a high frequency power of a preset frequency in a high-pressure environment while supplying a $CF_4$ gas, and the $SiO_2$ film 65 on the ACL 61 is etched thinly in overall. The $SiO_2$ film 65 on the bottom of the opening 70 is removed. On the top surface of the SiON film 62 and at the bottom of the opening 71, the $SiO_2$ film 65 is formed thicker than that in the opening 70. Therefore, if the etching is ended at the moment when the $SiO_2$ film 65 on the bottom of the opening 70 is removed, the $SiO_2$ film 65 remains on the top surface of the SiON film 62 and at the bottom of the opening 71. Here, by way of adjusting processing conditions for the CVD and using conditions having worse step coverage, if the $SiO_2$ film 65 is formed thick on the top surface of the SiON film 62 and on the bottom of the opening 71 whereas it is not formed on the bottom of the opening 70, the etching of the $SiO_2$ film 65 need not be performed after the film formation.

Subsequently, the ACL 61 is etched by using the SiON film 62 as a mask (process S13). Plasma is formed by applying the high frequency power of the preset frequency while supplying, for example, an $O_2$ gas, and the ACL 61 is plasma-etched. As the etching progresses, the opening 70 is deepened. Meanwhile, since the opening 71 is protected by the $SiO_2$ film 65, the etching does not progress easily thereat. As a result, as depicted in FIG. 5E, the opening 71 can be formed to have a depth smaller than a depth of the opening 70. Further, it may be determined whether the depths of the openings 71 and 70 satisfy a required condition (process S14), and if not, the processes S12 and S13 may be performed again. For example, if the $SiO_2$ film 65 on the bottom of the opening 71 is removed by the etching and the bottom of the opening 71 is thus etched more than required, the processing returns to the process S12, and the $SiO_2$ film 65 is formed on the bottom of the opening 71 again and the ACL 61 is plasma-etched. By repeating FIG. 5D and FIG. 5E when necessary, the depths of the openings 70 and 71 can be adjusted individually.

Thereafter, as shown in FIG. 5F, the SiON film 62 is removed. The opening 71 having the width larger than that of the opening 70 and the depth smaller than that of the opening 70 is formed in the ACL 61 of the wafer W at an outside of the multiple openings 70 while being spaced apart from the outermost openings 70 at the distance d2 which is equivalent to the distance d1. Further, the SiON film 62 may be removed by the subsequent process of etching the stacked film 60.

Then, for the wafer W having the above-described structure, the stacked film 60 is etched by using the ACL 61 as a mask, so that the openings 70 can be formed in the stacked film 60 to have the same depth, as shown in FIG. 5G and FIG. 5H.

<Apparatus Configuration>

Figure 6:
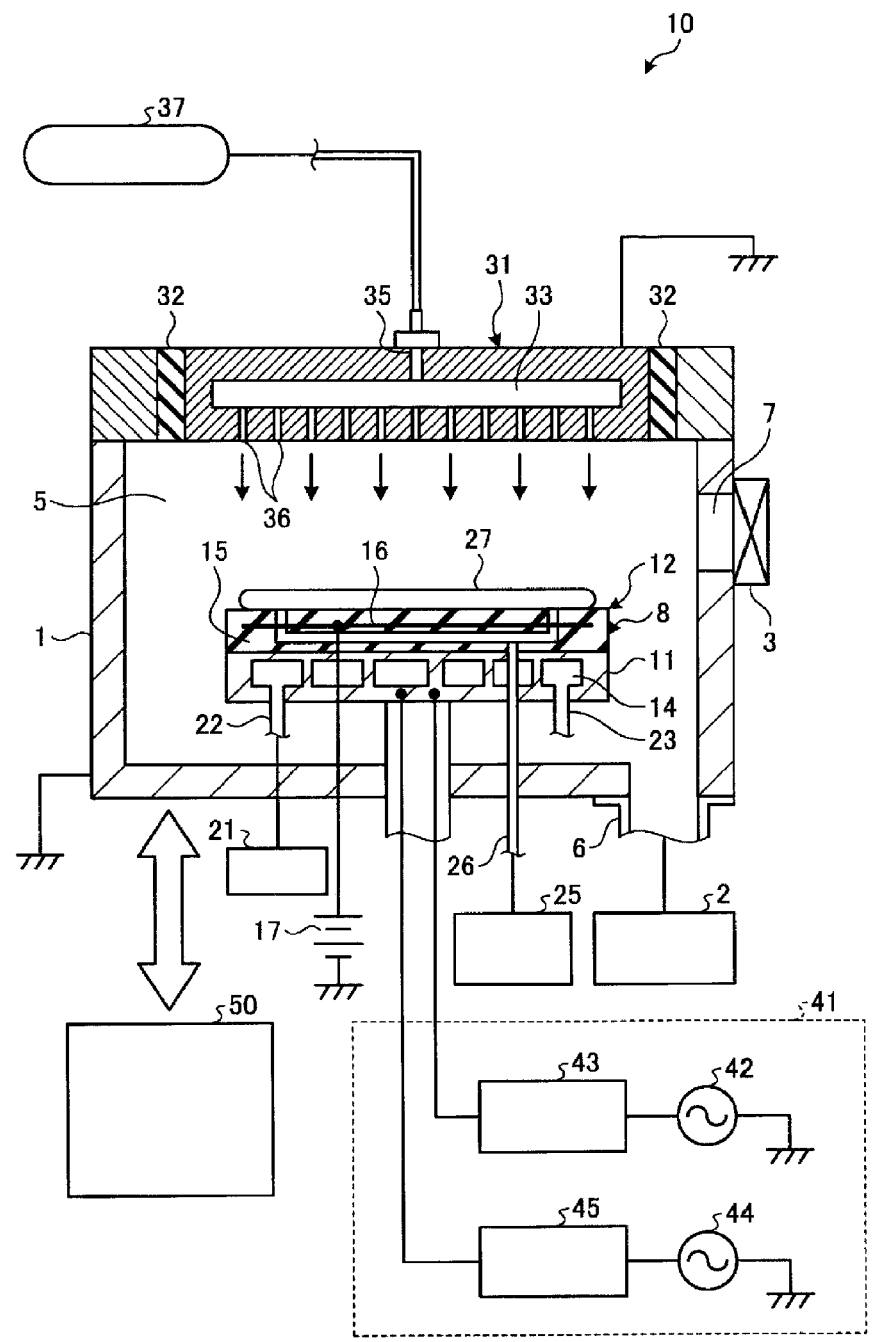
FIG. 6 is a longitudinal cross sectional view illustrating an example of a substrate processing apparatus according to the exemplary embodiment.

Now, a substrate processing apparatus 10 for use in manufacturing a substrate having a structure according to the exemplary embodiment and for use in etching the substrate according to the present exemplary embodiment will be explained. FIG. 6 is a longitudinal cross sectional view illustrating an example of the substrate processing apparatus 10 according to the exemplary embodiment. The substrate processing apparatus 10 is a capacitively coupled plasma processing apparatus. The substrate processing apparatus 10 includes a chamber 1, an exhaust device 2, and a gate valve 3. The chamber 1 is made of aluminum and has a cylindrical shape. A surface of the chamber 1 is alumite-treated (anodically oxidized). The chamber 1 is electrically grounded. A processing space 5 is formed within the chamber 1. The chamber 1 isolates the processing space 5 from an external atmosphere. The chamber 1 is further provided with an exhaust port 6 and an opening 7. The exhaust port 6 is formed at a bottom of the chamber 1. The opening 7 is formed at a sidewall of the chamber 1. The exhaust device 2 is connected to the processing space 5 of the chamber 1 through the exhaust port 6. The exhaust device 2 is configured to exhaust a gas from the processing space 5 through the exhaust port 6. The gate valve 3 is configured to open or close the opening 7.

The substrate processing apparatus 1 is further equipped with a placing table 8. The placing table 8 is disposed in the processing space 5 and installed at a bottom of the chamber 1. The placing table 8 includes a supporting table 11 and an electrostatic chuck 12. The supporting table 11 is formed of a conductor such as, but not limited to, aluminum (Al), titanium (Ti) or silicon carbide (SiC). The supporting table 11 is supported at the chamber 1. A coolant path 14 is formed within the supporting table 11. The electrostatic chuck 12 is mounted on top of the placing table 11 and supported by the supporting table 11. The electrostatic chuck 12 includes an electrostatic chuck main body 15 and a chuck electrode 16. The electrostatic chuck main body 15 is formed of an insulator. The electrostatic chuck 12 has a structure in which the chuck electrode 16 is embedded in the electrostatic chuck main body 15. The substrate processing apparatus 10 is further equipped with a DC voltage source 17. The DC voltage source 17 is electrically connected to the chuck electrode 16 and supplies a direct current to the chuck electrode 16.

The substrate processing apparatus 10 further includes a chiller 21, a coolant inlet line 22 and a coolant outlet line 23. The chiller 21 is connected to the coolant path 14 via the coolant inlet line 22 and the coolant outlet line 23. The chiller 21 is configured to cool a cooling medium such as cooling water or brine and circulate the cooled cooling medium in the coolant path 14 through the coolant inlet line 22 and the coolant outlet line 23 to thereby cool the electrostatic chuck 12 of the placing table 8.

The substrate processing apparatus 10 is further equipped with a heat transfer gas source 25 and a heat transfer gas supply line 26. One end of the heat transfer gas supply line 26 is formed at a top surface of the electrostatic chuck 12. The heat transfer gas source 25 supplies a heat transfer gas such as, but not limited to, a helium gas (He) or an argon gas (Ar) into the heat transfer gas supply line 26. The heat transfer gas is then supplied into a gap between the wafer 27 and the electrostatic chuck 12 placing on the placing table 8.

The substrate processing apparatus 10 further includes a gas shower head 31 and a shield ring 32. The gas shower head 31 is formed of a conductor and has a circular plate shape. The gas shower head 31 is disposed to face the placing table 8 such that a plane along a bottom surface of the gas shower head 31 is parallel with a plane along a top surface of the placing table 8. Further, the gas shower head 31 is disposed to close an opening formed at a ceiling portion of the chamber 1. The shield ring 32 is made of an insulating material and has a ring shape. The shield ring 32 covers a peripheral portion of the gas shower head 31. The gas shower head 31 is supported at the chamber 1 with the shied ring 32 therebetween so that the gas shower head 31 and the chamber 1 are insulated from each other. The gas shower head 31 is electrically grounded. Further, the gas shower head 31 may be connected to a variable DC power supply, and a preset DC voltage may be applied thereto.

The gas shower head 31 has a gas diffusion space 33, a gas inlet port 35, and a multiple number of gas supply hoes 36. The gas diffusion space 33 is formed within the gas shower head 31. The gas inlet port 35 is formed above the gas diffusion space 33 of the gas shower head 31 and communicate with the gas diffusion space 33. The gas supply holes 36 are formed under the gas diffusion space 33 of the gas shower head 31. Upper ends of the gas supply holes 36 are connected to the gas diffusion space 33 and lower ends thereof are connected to the processing space 5.

The substrate processing apparatus 10 further includes a processing gas source 37. The processing gas source 37 is connected to the gas inlet port 35. The processing gas source 37 is configured to supply various kinds of processing gases into the gas inlet port 35. By way of example, the processing gas source 37 supplies various kinds of gases for use in the etching of the antireflection film 63 and the SiON film 62, the etching of the ACL 61, and the etching of the stacked film 60. Further, the processing gas source 37 also supplies various kinds of gases for use in the formation of the $SiO_2$ film 65. Moreover, the processing gas source 37 may be plural in number. By way of example, the processing gas source 37 may be provided for each of the processing gases for use in the etching, the film formation and the etching of the atomic layer.

The supporting table 11 of the placing table 8 is used as a lower electrode, and the gas shower head 31 is used as an upper electrode. The substrate processing apparatus 10 is further equipped with a power supply device 41. The power supply device 41 includes a first high frequency power supply 42, a first matching device 43, a second high frequency power supply 44, and a second matching device 45. The first high frequency power supply 42 is connected to the placing table 8 via the first matching device 43. The first high frequency power supply 42 supplies a first high frequency power having a first frequency (e.g., 40 MHz) to the supporting table 11 of the placing table 8 at a preset power level. The first matching device 43 is configured to match a load impedance with an internal (or an output) impedance of the first high frequency power supply 42. The first matching device 43 serves to control the internal impedance of the first high frequency power supply 42 and the load impedance to be apparently matched with each other, when the plasma is formed within the processing space 5.

The second high frequency power supply 44 is connected to the placing table 8 via the second matching device 45. The second high frequency power supply 44 supplies a second high frequency power having a second frequency (e.g., 0.3

MHz) lower than the first frequency to the placing table 8 at a preset power level. The second matching device 45 is configured to match the load impedance with an internal (or an output) impedance of the second high frequency power supply 44. The second matching device 45 serves to control the internal impedance of the second high frequency power supply 44 and the load impedance to be apparently matched with each other, when the plasma is formed within the processing space 5. Further, though the first high frequency power and the second high frequency power are applied to the placing table 8 in the present exemplary embodiment, the first and second high frequency powers may be applied to the gas shower head 31.

The substrate processing apparatus 10 is further equipped with a controller 50. The controller 50 controls individual components of the substrate processing apparatus 10. The controller 50 is, for example, a computer, and includes a CPU (Central Processing Unit), a RAM (Random Access Memory), a ROM (Read Only Memory), or an auxiliary storage device. The CPU is operated based on a computer program stored in the ROM or the auxiliary storage device, or a recipe including processing conditions and the like, and controls an overall operation of the apparatus. Further, a computer-readable program for use in the control over the individual components may be stored in a recording medium. The recording medium may be implemented by, for example, a flexible disc, a CD (Compact Disc), a CD-ROM, a hard disk, a flash memory, a DVD, or the like. Further, the controller 50 may be provided at an inside or an outside of the substrate processing apparatus 10. In case that the controller 50 is provided at the outside of the substrate processing apparatus 10, the controller 50 may control the substrate processing apparatus 10 by a wired or wireless communication device.

The controller 50 is operated according to the computer program (a program based on the inputted recipe) for controlling the individual components of the substrate processing apparatus 10, and transmits control signals in each process of the substrate processing method according to the exemplary embodiment. The individual components of the substrate processing apparatus 10 are controlled in response to the control signals from the controller 50. By way of example, in the substrate processing apparatus 10, the controller 50 controls selection of the gas supplied from the processing gas source 37, the flow rate of the selected gas, and the exhaust of the gas by the exhaust device 2 by using the control signals. Further, the controller 50 also controls the power supplies from the first and second high frequency power supplies 42 and 44, the voltage application from the DC voltage source 17, and a flow rate and a temperature of the coolant from the chiller unit 21. The individual processes of the substrate processing method disclosed in the present exemplary embodiment are performed as the individual components of the substrate processing apparatus 10 are operated under the control of the controller 50. The computer program for implementing the substrate processing method according to the exemplary embodiment and various kinds of data for use in implementing in this method are stored in the storage of the controller 50 to be read out.

[Effects of Exemplary Embodiment]

The wafer W according to the above-described exemplary embodiment includes the stacked film 60 as a target of the etching and the ACL 61. The ACL 61 is formed on the stacked film 60 and made of the material having the etching rate smaller than the etching rate of the stacked film 60. The ACL 61 is provided with the multiple openings 70 (first openings) which are formed at the distance d1 (first distance) therebetween in one direction of the surface of the ACL 61. The ACL 61 is also provided with the openings 71 (second openings) which are formed at the outside of the multiple openings 70 while being spaced from the outermost opening 70a by the distance d2 (second distance) which is equivalent to the distance d1. Each opening 71 has the width larger than that of the opening 70 and the depth smaller than that of the opening 70. Accordingly, when the stacked film 60 is etched by using the ACL 61 as the mask, the wafer W can be suppressed from having discrepancy in the shape of the individual openings 70 formed in the stacked film 60.

Furthermore, in the wafer W according to the present exemplary embodiment, the openings 70 are extended to the stacked film 60, whereas the openings 71 do not reach the stacked film 60. Accordingly, in the wafer W according to the present exemplary embodiment, when etching the stacked film 60 by using the ACL 61 as the mask, it is possible to suppress the openings 71 from being formed in the stacked film 60.

Moreover, in the wafer W according to the present exemplary embodiment, the openings 70 are formed at the portions corresponding to where the openings of the stacked film 60 will be formed, and the openings 71 are formed at the portions corresponding to where no opening will be formed in the stacked film 60. In the wafer W according to the present exemplary embodiment, by forming the openings 71 at the portions where the openings will not be formed in the stacked film 60, the discrepancy in the shape of the individual openings 70 formed in the stacked film 60 can be suppressed.

In addition, in the wafer W according to the present exemplary embodiment, each opening 71 is formed to have the depth set to allow the opening 71 not to reach the stacked film 60 at the end of the etching of the stacked film 60 using the ACL 61 as the mask and allow the depth from the top surface of the ACL 61 to become equal to or larger than the preset value. Accordingly, the opening 71 which does not reach the stacked film 60 upon the completion of the etching while allowing the partition wall 81 to be formed between the opening 70 and the opening 71 can be formed in the wafer W.

Further, in the wafer W according to the present exemplary embodiment, the ACL 61 made of the material having the etching rate lower than that of the stacked film 60 is formed on the stacked film 60, and the SiON film 62 is formed on the ACL 61. In the substrate processing method according to the present exemplary embodiment, the multiple openings 70 are formed in the SiON film 62 of the wafer W at the regular distance d1 therebetween along the one direction of the surface of the ACL 61. Furthermore, in the substrate processing method according to the present exemplary embodiment, the openings 71 having the width larger than that of the openings 70 are formed at the outside of the multiple openings 70 in the one direction while being spaced from the outermost opening 70a by the distance d2 which is equivalent to the distance d1. In the substrate processing method according to the exemplary embodiment, the multiple openings 70 and the openings 71 are formed in the ACL 61 by etching the ACL 61 while using the SiON film 62 as the mask. Further, in the substrate processing method according to the exemplary embodiment, the $SiO_2$ film 65 is formed at the bottoms of the openings 71 formed in the ACL 61. In the substrate processing method according to the present exemplary embodiment, the stacked film 60 is etched by using the ACL 61, which has the $SiO_2$ film 65 formed at the bottoms of the openings 71, as the mask. In the substrate processing method according to the present exemplary embodiment, it is possible to form the wafer W having the multiple openings 70 formed at the distance d1 therebetween in the one direction of the ACL 61 and the openings 71 formed to have the width large than that of the openings 70 and the depth smaller than that of the openings 70 while being spaced from the outermost opening 70a by the distance d2.

So far, the exemplary embodiments have been described. However, it should be noted that the above-described exemplary embodiments are illustrative in all aspects and are not anyway limiting. The above-described exemplary embodiments may be omitted, replaced and modified in various ways without departing from the scope and the spirit of claims.

By way of example, the above exemplary embodiment has been described for the example of manufacturing the three-dimensional stacked semiconductor memory while the etching target film is the stacked film 60, the first film is the ACL 61, the second film is the SiON film 62 and the protective film is the SiO$_2$ film 65. However, the exemplary embodiment is not limited thereto. By way of example, the exemplary embodiment may be applicable to a wiring forming process (so-called BEOL (Back End of Line)). In such a case, the etching target film may be a SiCOH film or a low-dielectric material film (Low-k film). The first film may be a spin-on hard (SOH) mask. The second film may be an antireflection film such as a Si-ARC film. The protective film may be a SiO$_2$ film. Further, the exemplary embodiment may be applied to a HARC (High Aspect Ratio Contact) process. In such a case, the etching target film may be a SiO$_2$ film, and the first film may be a polysilicon (Poly-Si) film. The second film may be a SiO$_2$ film, and the protective film may be a SiO$_2$ film. The SiO$_2$ film as the protective film may be formed by CVD using, for example, a SiCl$_4$ gas, or a TEOS gas and an O$_2$ gas. Further, the exemplary embodiment may be applied to a silicon processing. In such a case, the etching target film may be polysilicon, and the first film may be an organic film. The second film may be a SiO$_2$ film, and the protective film may be an organic film. The organic film as the protective film may be formed by CVD using, by way of non-limiting example, a CH$_4$ gas.

Additionally, optimal values are selected for the various sizes h1, d1, h2 and d2 depending on the processes involved. Further, to meet a trend for miniaturization of semiconductor devices, these various sizes are expected to be reduced further. In any of various cases, if the relationship between the various sizes in the mask (first film) is established as described in the above exemplary embodiment, the discrepancy in the shape of openings formed in the etching target film can be suppressed.

Further, though the above exemplary embodiment has been described for the case where the silicon wafer is used as the substrate, the exemplary embodiment is not limited thereto. By way of example, various kinds of substrates such as a compound semiconductor, a glass substrate, a ceramic substrate, and so forth may be used.

According to the exemplary embodiment, it is possible to suppress discrepancy in the shape of the openings formed in the etching target film.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate, comprising:
   an etching target film, being a stacked film composed of a silicon oxide film and a silicon nitride film, as a target of etching; and
   a first film including an amorphous carbon layer, formed on the etching target film and made of a material having an etching rate smaller than an etching rate of the etching target film when plasma-etched, having multiple first openings formed at a first distance therebetween in one direction of a surface of the first film and a second opening formed at an outside of the multiple first openings in the one direction while being spaced apart from an outermost one of the first openings by a second distance equivalent to the first distance, the second opening having a width larger than a width of one of the first openings and a depth smaller than a depth of one of the first openings.

2. The substrate of claim 1,
   wherein the first openings are extended to reach the etching target film, and
   the second opening does not reach the etching target film.

3. The substrate of claim 1,
   wherein the first opening is formed at a portion corresponding to where an opening of the etching target film is to be formed, and
   the second opening is formed at a portion corresponding to where no opening of the etching target film is to be formed.

4. The substrate of claim 1,
   wherein the second opening is formed to have a depth in a range allowing the second opening not to reach the etching target film at an end of etching of the etching target film with the first film as a mask and also allowing a depth from a top surface of the first film to become equal to or larger than a preset value.

5. A substrate having thereon an etching target film, comprising:
   a mask, formed on the etching target film, having multiple first openings formed at a first distance therebetween in one direction of a surface of the mask and a second opening formed at an outside of the multiple first openings in the one direction while being spaced apart from an outermost one of the first openings by a second distance equivalent to the first distance, the second opening having a width larger than a width of one of the first openings and a depth smaller than a depth of one of the first openings,
   wherein the first opening is formed at a portion corresponding to where an opening of the etching target film is to be formed and extended to reach the etching target film, and
   the second opening is formed at a portion corresponding to where no opening of the etching target film is to be formed and does not reach the etching target film,
   wherein the mask is selected from the group consisting of an amorphous carbon layer (ACL), a spin-on hard (SOH) mask, a polysilicon (Poly-Si) film and an organic film, and
   the etching target film is selected from the group consisting of a SiCOH film, a low-dielectric material film, a SiO$_2$ film, and a polysilicon (Poly-Si) film.

6. The substrate of claim 5,
wherein the second opening is formed to have a depth in a range allowing the second opening not to reach the etching target film and also allowing a depth from a top surface of the mask to become equal to or larger than a preset value.

7. A substrate processing method,
wherein a substrate has an etching target film, being a stacked film composed of a silicon oxide film and a silicon nitride film, as a target of etching; a first film including an amorphous carbon layer formed on the etching target film and made of a material having an etching rate smaller than an etching rate of the etching target film when plasma-etched; and a second film formed on the first film,
wherein the substrate processing method comprises:
forming, in the second film, multiple first openings at a first distance therebetween in one direction of a surface of the first film and forming a second opening having a width larger than a width of one of the first openings at an outside of the multiple first openings in the one direction while being spaced apart from an outermost one of the first openings by a second distance equivalent to the first distance;
forming the multiple first openings and the second opening in the first film by etching the first film with the second film as a mask;
forming a protective film at a bottom of the second opening formed in the first film; and
etching the etching target film with the first film, which has the protective film formed at the bottom of the second opening, as a mask.

8. The substrate processing method of claim 7,
wherein the forming of the multiple first openings and the second opening in the first film by etching the first film and the forming of the protective film are repeated until a depth of the first openings and a depth of the second opening satisfy a preset condition that the depth of the second opening is smaller than the depth of one of the first openings.

\* \* \* \* \*